United States Patent
Kools et al.

(10) Patent No.: US 7,071,118 B2
(45) Date of Patent: Jul. 4, 2006

(54) METHOD AND APPARATUS FOR FABRICATING A CONFORMAL THIN FILM ON A SUBSTRATE

(75) Inventors: Jacques C. S. Kools, Sunnyvale, CA (US); Randhir Bubber, San Ramon, CA (US); Ming Mao, Pleasanton, CA (US); Thomas Andrew Schneider, Livermore, CA (US); Jinsong Wang, Pleasanton, CA (US)

(73) Assignee: Veeco Instruments, Inc., Woodbury, NY (US)

( * ) Notice: Subject to any disclaimer, the term of this patent is extended or adjusted under 35 U.S.C. 154(b) by 203 days.

(21) Appl. No.: 10/706,637

(22) Filed: Nov. 12, 2003

(65) Prior Publication Data

US 2005/0100669 A1 May 12, 2005

(51) Int. Cl.
*H01L 21/31* (2006.01)

(52) U.S. Cl. .................. 438/761; 438/763; 118/723 E; 118/723 R (58) Field of Classification Search ................ 438/758, 438/761, 762, 763, 674; 118/715, 723 E, 118/723 R, 723 ER, 723 I, 723 IR
See application file for complete search history.

(56) References Cited

U.S. PATENT DOCUMENTS

| | | | |
|---|---|---|---|
| 5,616,177 A | 4/1997 | Yamada | 117/102 |
| 5,647,911 A | 7/1997 | Vanell et al. | 118/715 |
| 5,711,811 A | 1/1998 | Suntola et al. | 118/711 |
| 5,879,459 A | 3/1999 | Gadgil et al. | 118/715 |
| 5,916,365 A | 6/1999 | Sherman | 117/92 |
| 5,916,369 A | 6/1999 | Anderson et al. | 118/715 |
| 5,930,046 A | 7/1999 | Solberg et al. | 359/580 |
| 5,944,964 A | 8/1999 | Solberg et al. | 204/192.26 |
| 6,015,590 A | 1/2000 | Suntola et al. | 427/255.23 |
| 6,144,060 A | 11/2000 | Park et al. | 257/310 |
| 6,174,377 B1 | 1/2001 | Doering et al. | 118/729 |
| 6,200,866 B1 | 3/2001 | Ma et al. | 438/299 |
| 6,200,893 B1 | 3/2001 | Sneh | 438/685 |
| 6,319,439 B1 | 11/2001 | Lee et al. | 264/81 |
| 6,335,240 B1 | 1/2002 | Kim et al. | 438/253 |
| 6,342,277 B1 | 1/2002 | Sherman | 427/562 |
| 6,358,632 B1 | 3/2002 | Dickey et al. | 428/690 |
| 6,387,185 B1 | 5/2002 | Doering et al. | 118/729 |
| 6,391,785 B1 | 5/2002 | Satta et al. | 438/704 |
| 6,416,577 B1 | 7/2002 | Suntola et al. | 117/88 |
| 6,420,230 B1 | 7/2002 | Derderian et al. | 438/255 |

(Continued)

FOREIGN PATENT DOCUMENTS

JP 62221102 9/1987

(Continued)

OTHER PUBLICATIONS

Addison, C.C. et al. "Tha Vapour Pressure of Anhydrous Copper Nitrate, and its Molecular Weight in the Vapour State", *J. Chem. Soc.*, pp. 3099-3106, 1958.

(Continued)

*Primary Examiner*—Kevin M. Picardat
(74) *Attorney, Agent, or Firm*—Baker Botts L.L.P.

(57) ABSTRACT

A method and apparatus for fabricating a conformal thin film on a substrate are disclosed. The method includes introducing a gas from a gas inlet into an expansion volume associated with an atomic layer deposition (ALD) system. The gas is flowed through a diffuser plate adjacent to the expansion volume and a reaction chamber. The diffuser plate includes a protrusion located opposite the gas inlet and the protrusion reduces turbulence in the expansion volume.

40 Claims, 6 Drawing Sheets

U.S. PATENT DOCUMENTS

| | | | |
|---|---|---|---|
| 6,441,417 B1 | 8/2002 | Zhang et al. | 257/295 |
| 6,444,495 B1 | 9/2002 | Leung et al. | 438/118 |
| 6,447,607 B1 | 9/2002 | Soininen et al. | 117/200 |
| 6,448,192 B1 | 9/2002 | Kaushik | 438/785 |
| 6,451,119 B1 | 9/2002 | Sneh et al. | 118/715 |
| 6,451,695 B1 | 9/2002 | Sneh | 438/685 |
| 6,464,779 B1 | 10/2002 | Powell et al. | 117/89 |
| 6,475,276 B1 | 11/2002 | Elers et al. | 117/84 |
| 6,475,910 B1 | 11/2002 | Sneh | 438/685 |
| 6,482,262 B1 | 11/2002 | Elers et al. | 117/84 |
| 6,482,740 B1 | 11/2002 | Soininen et al. | 438/686 |
| 6,503,330 B1 | 1/2003 | Sneh et al. | 118/715 |
| 6,506,255 B1 | 1/2003 | Kim | 118/715 |
| 6,506,352 B1 | 1/2003 | Lindfors et al. | 423/240 |
| 6,511,539 B1 | 1/2003 | Raaijmakers | 117/102 |
| 6,524,952 B1 | 2/2003 | Srinivas et al. | 438/649 |
| 6,539,891 B1 | 4/2003 | Lee et al. | 118/723 |
| 6,540,838 B1 | 4/2003 | Sneh et al. | 118/715 |
| 6,548,424 B1 | 4/2003 | Putkonen | 438/785 |
| 6,551,406 B1 | 4/2003 | Kilpi | 118/728 |
| 6,562,140 B1 | 5/2003 | Bondestam et al. | 118/715 |
| 6,572,705 B1 | 6/2003 | Suntola et al. | 118/702 |
| 6,579,374 B1 | 6/2003 | Bondestam et al. | 118/725 |
| 6,599,572 B1 | 7/2003 | Saanila et al. | 427/249.18 |
| 6,602,784 B1 | 8/2003 | Sneh | 438/680 |
| 6,616,986 B1 | 9/2003 | Sherman | 427/562 |
| 6,620,723 B1 | 9/2003 | Byun et al. | 438/627 |
| 6,627,268 B1 | 9/2003 | Fair et al. | 427/533 |
| 6,630,030 B1 | 10/2003 | Suntola et al. | 118/728 |
| 6,630,401 B1 | 10/2003 | Sneh | 438/680 |
| 6,632,279 B1 | 10/2003 | Ritala et al. | 117/101 |
| 6,635,965 B1 | 10/2003 | Lee et al. | 257/758 |
| 6,638,810 B1 | 10/2003 | Bakli et al. | 438/240 |
| 6,638,859 B1 | 10/2003 | Sneh et al. | 438/680 |
| 6,638,862 B1 | 10/2003 | Sneh | 438/685 |
| 6,652,924 B1 | 11/2003 | Sherman | 427/576 |
| 6,660,126 B1 | 12/2003 | Nguyen et al. | 156/345.34 |
| 6,664,192 B1 | 12/2003 | Satta et al. | 438/704 |
| 6,679,951 B1 | 1/2004 | Soininen et al. | 148/240 |
| 6,689,210 B1 | 2/2004 | Soininen et al. | 117/89 |
| 6,720,260 B1 | 4/2004 | Fair et al. | 438/680 |
| 6,727,169 B1 | 4/2004 | Raaijmakers et al. | 438/622 |
| 6,734,020 B1 | 5/2004 | Lu et al. | 436/55 |
| 6,759,081 B1 | 7/2004 | Huganen et al. | 427/58 |
| 6,764,546 B1 | 7/2004 | Raaijmakers | 117/93 |
| 6,767,582 B1 | 7/2004 | Elers | 427/253 |
| 6,777,353 B1 | 8/2004 | Putkonen | 438/785 |
| 6,794,287 B1 | 9/2004 | Saanila et al. | 438/674 |
| 6,800,173 B1 | 10/2004 | Chiang et al. | 156/345.33 |
| 6,800,552 B1 | 10/2004 | Elers et al. | 438/680 |
| 6,811,814 B1 | 11/2004 | Chen et al. | 427/248.1 |
| 6,818,067 B1 | 11/2004 | Doering et al. | 118/715 |
| 6,820,570 B1* | 11/2004 | Kilpela et al. | 118/723 R |
| 6,821,889 B1 | 11/2004 | Elers et al. | 438/680 |
| 6,821,910 B1* | 11/2004 | Adomaitis et al. | 438/758 |
| 2001/0024125 A1 | 9/2001 | Raaijmakers et al. | 365/200 |
| 2002/0013487 A1 | 1/2002 | Norman et al. | 556/7 |
| 2002/0041931 A1 | 4/2002 | Suntola et al. | 427/255.28 |
| 2002/0106846 A1 | 8/2002 | Seutter et al. | 438/200 |
| 2002/0108570 A1 | 8/2002 | Lindfors | 118/715 |
| 2002/0137260 A1 | 9/2002 | Leung et al. | 438/118 |
| 2002/0140103 A1 | 10/2002 | Kloster et al. | 257/767 |
| 2002/0187084 A1 | 12/2002 | Lindfors et al. | 422/177 |
| 2003/0003635 A1 | 1/2003 | Paranjpe et al. | 438/149 |
| 2003/0096468 A1 | 5/2003 | Soininen et al. | 438/200 |
| 2003/0101927 A1 | 6/2003 | Raaijmakers | 117/200 |
| 2003/0116087 A1 | 6/2003 | Nguyen et al. | 118/715 |
| 2003/0121469 A1 | 7/2003 | Lindfors et al. | 117/105 |
| 2003/0140854 A1 | 7/2003 | Kilpi | 118/715 |
| 2003/0150385 A1 | 8/2003 | Bondestam et al. | 118/722 |
| 2003/0183171 A1 | 10/2003 | Sneh et al. | 118/724 |
| 2004/0005753 A1 | 1/2004 | Kostamo et al. | 438/222 |
| 2004/0007171 A1 | 1/2004 | Ritala et al. | 117/89 |
| 2004/0076751 A1 | 4/2004 | Sherman | 427/255.34 |
| 2004/0076837 A1 | 4/2004 | Hein et al. | 428/446 |
| 2004/0083949 A1 | 5/2004 | Sherman | 117/84 |
| 2004/0121616 A1 | 6/2004 | Satta et al. | 438/778 |
| 2004/0130029 A1 | 7/2004 | Raaijmakers et al. | 257/758 |
| 2004/0161636 A1 | 8/2004 | Hujanen et al. | 428/692 |
| 2004/0202786 A1 | 10/2004 | Wongsenakhum et al. | 427/250 |

FOREIGN PATENT DOCUMENTS

| | | |
|---|---|---|
| WO | 00/38191 | 6/2000 |
| WO | 01/88972 | 11/2001 |
| WO | 02/09126 | 1/2002 |
| WO | 02/09158 | 1/2002 |

OTHER PUBLICATIONS

Akerman, J.J. et al., "Identifying Tunneling in Ferromagnetic-Insulator-Ferromagnetic Thin Film Structures", World-wide web, physics.ucsd.edu/ksgrp/Tunneling.html, pp. 1-6, Printed Feb. 4, 2002.

Bobo, J.F. et al., "Spin-dependent Tunneling Junctions with Hard Magnetic layer Pinning", *Journal of Applied Physics*, vol. 83, No. 11, pp. 6685-6687, 1998.

Daughton, J.M., World-wide web nve.com/otherbiz/mram2.pdf, "Advanced MRAM Concepts", pp. 1-6, Feb. 7, 2001.

Fereday, R.J. et al., "Anhydrous Cobalt (III) Nitrate", *Chemical Communications*, pp. 271, 1968.

Hsaio, R., "Fabrication of Magnetic Recording Heads and Dry Etching Head Materials", IBM Journal of Research and Development, vol. 43, (1/2):1999, pp. 89-102, 1999.

Imai, Takuji, World-wide web nikkeibp.asiabiztech.com/nea/200008/tech_108675.html, "100 Gbit/Inch HDD Just Around the Corner", pp. 1-6, Aug. 2000.

Nilsen, O et al, "Thin Film Deposition of lanthanum Manganite Perovskite by the ALE Process", *Journal of Materials Chemistry*, vol. 9, pp. 1781-1784, 1999.

Pakrad, C.D., "Pure Tech: Growth of MR/GMR Head Materials," World-wide web, puretechinc.com/tech_papers/tech_papers-4.htm, pp. 1-2, 1999.

Riihela et al., "Low Temperature Deposition of AlN Films by an Alternate Syppy of Trimethyl Aluminum and Ammonia" Chemical Vapor Deposition, 2 (6): pp. 277-283, 1996.

Suntola, Tuomo; *Handbook of Crystal Growth*, vol. 3, Thin Films and Epitaxy, Part B: Growth Mechanisms and Dynamics, Chapter 14, pp. 601-663, Hurle, ed. Elsevier Science B.V., 1994.

Ueno et al., "Cleaning of CHF3, plasma-etched SiO2/SiN/CU via Structures Using a Hydrogen Plasma, an Oxygen Plasma and Hexafluoroacetylacetone Vapors," *J. VAc. Sci. Technology B*, vol. 16, No. 6, pp. 2986-2995, Nov./Dec. 1998.

Utriainen, et al., "Studies of Metallic Film Growth in an Atomic Layer Epitaxy reactor Using M(acac)2(M=Ni, Cu, Pt) Precursors", Applied Surface Science, vol. 157, pp. 151-158, 2000.

Wang, Shan X., "Advanced Materials for Extremely High Density Magnetic Reocrding Heads," Department of Electrical Engineering, Stanford University, Standford, CA 94305-4045, presentation, no date available.

World-wide web, megahaus.com/tech/westerndigital/shitepapers/gmr_wp.shtml., "GMR Head Technology: Increased Areal Density and Improved Performance Areal Density," pp. 1-4, Feb. 2000.

World-wide web, pcguide.com/ref/hdd/op/heads/techGMR-c.html, "Giant Magnetoresistive (GMR) Heads", pp. 1-4, Printed Dec. 18, 2004.

World-wide web, semiconductor.net/semiconductor/issues/1998/feb98/docs/emerging.asp, "GMR Read-Write Heads Yield Data Storage Record," pp. 1-2, Feb. 1998.

World-wide web, stoner.leeds.ac.uk/research/gmr.htm, "Giant Magnetoresistance (GMR) Heads", pp. 1-6, Printed Feb. 4, 2002.

Omstead, Thomas, et al.; "Filling High-AR Structures Using Pulsed Nucleation Layer Deposition", Solid State Technology, vol. 45, pp. 51-56, Sep. 2002.

Ritala, Mikko, et al.; "Atomic Layer Epitaxy—a Valuable Tool for Nanotechnology?", Nanotechnology, vol. 10, pp. 19-24, 1999.

International Search Report, PCT US2004037172, 11 pages, Mailing Date May 25, 2005.

* cited by examiner

METHOD AND APPARATUS FOR FABRICATING A CONFORMAL THIN FILM ON A SUBSTRATE

TECHNICAL FIELD OF THE INVENTION

The present invention generally relates to film deposition, and more particularly to a method and apparatus for fabricating a conformal thin film on a substrate.

BACKGROUND OF THE INVENTION

Atomic layer deposition (ALD), also known as sequential pulsed chemical vapor deposition (SP-CVD), atomic layer epitaxy (ALE) and pulsed nucleation layer (PNL) deposition, has gained acceptance as a technique for depositing thin and continuous layers of metals and dielectrics with high conformality. In an ALD process, a substrate is alternately dosed with a precursor and one or more reactant gases so that reactions are limited to the surface of a substrate. Uniform adsorption of precursors on the wafer surface during the ALD process produces highly conformal layers at both microscopic feature length scales and macroscopic substrate length scales, and achieves a high density of nucleation sites. These attributes result in the deposition of spatially uniform, conformal, dense and continuous thin films.

Although ALD techniques support deposition of conformal thin layers, a drawback of the technique is the low average deposition rate, which is related to the need to repeat several cycles having finite durations. For example, the repeated cycle of precursor and reactant adsorption and the intervening chamber purges is time consuming, which results in reduced throughput relative to conventional deposition techniques. Specifically, an ALD sequence includes at least two purge pulses and these purge pulses are typically the most time consuming portion of the ALD sequence. Therefore, improvements in ALD equipment have focused on techniques to decrease the time needed to complete a purge pulse.

The most logical solution to decreasing the duration of the purge pulse is to flow the purge gas at higher speeds through the reactor, which may be achieved by increasing the flow rate of the purge gas. Typical flow rates used in the industry are several standard liters per minute (SLM) (e.g., approximately 2.5 SLM) at pressures of between approximately 0.2 and approximately 20 Torr. These flow rates lead to substantially higher gas flow speeds than obtained in conventional CVD processes.

One of the effects of increasing purge gas flow speed is the occurrence of turbulence in the gas injector. Typically, the turbulence occurs in an expansion zone of a gas injector near an inlet used to supply the purge gas. Turbulence in the expansion zone may cause the flow pattern of the purge gas across a conventional diffuser plate to be altered. Specifically, the fraction of the total flow passing through the openings in the diffuser plate located near the turbulent zone decreases significantly. The decrease in gas flow through openings near the turbulent zone when compared to the gas flow through openings located away from the turbulent zone may create an uneven distribution of precursor during a doping, which ultimately forms a non-uniform film on a substrate. Additionally, recirculation of gas in the expansion zone caused by the turbulence leads to inefficient purging of the precursors from the expansion zone, which may cause gas phase reactions that form a powder in the expansion zone.

SUMMARY OF THE INVENTION

In accordance with the present invention, the disadvantages and problems associated with fabricating conformal thin films on a substrate have been substantially reduced or eliminated. In a particular embodiment, an apparatus for fabricating conformal thin films on a substrate is disclosed that include a diffuser plate having a protrusion that reduces turbulence in an expansion volume associated with a gas injector.

In accordance with one embodiment of the present invention, a method for fabricating Conformal thin films on a substrate includes introducing a gas from a gas inlet into an expansion volume associated with an atomic layer deposition (ALD) system. The gas is flowed through a diffuser plate adjacent to the expansion volume and a reaction chamber. The diffuser plate includes a protrusion located opposite the gas inlet, which reduces turbulence in the expansion volume.

In accordance with another embodiment of the present invention, an apparatus for fabricating conformal thin films on a substrate includes a reaction chamber and a gas injector located adjacent to the reaction chamber. The gas injector includes an expansion volume and a gas inlet for introducing a gas into the expansion volume. A diffuser plate is located adjacent to the expansion volume and the reaction chamber. A protrusion that reduces turbulence in the expansion volume is located adjacent to the diffuser plate and opposite the gas inlet.

In accordance with a further embodiment of the present invention, an apparatus for fabricating conformal thin films on a substrate includes a reaction chamber and a gas injector located adjacent to the reaction chamber. The gas injector includes an expansion volume and a gas inlet for introducing an inert gas into the expansion volume. A diffuser plate located adjacent to the expansion volume and the reaction chamber includes a bevel that is located opposite the gas inlet, and reduces turbulence and gas phase reactions in the expansion volume.

Important technical advantages of certain embodiments of the present invention include a diffuser plate that suppresses turbulence in a gas injector over a wide range of flow rates. The diffuser plate includes a protrusion located opposite a gas inlet of a gas injector. The protrusion prevents gas flowing from the gas inlet from bouncing off the surface of the diffuser plate and recirculating in an area around the gas inlet. The protrusion, therefore, facilitates laminar gas flow in an expansion volume of a gas injector associated with an ALD system.

Another important technical advantage of certain embodiments of the present invention includes a diffuser plate that increases throughput of an ALD system. The diffuser plate includes a protrusion that facilitates laminar gas flow throughout an expansion volume of a gas injector. The laminar gas flow allows the gas during a purge pulse of an ALD process to remove residual precursor from the expansion volume. By more effectively removing the precursor, gas phase reactions during a subsequent purge pulse may be reduced or even eliminated, thus decreasing the frequency of cleaning processes.

A further important technical advantage of certain embodiments of the present invention includes a diffuser plate that uniformly distributes a precursor in a reaction chamber. During a doping, a precursor combined with a gas may be flowed through the diffuser plate. A protrusion on the diffuser plate facilitates a laminar gas flow within an expansion volume. Because gas/precursor mixture flows in a laminar manner within the expansion volume, the gas/precursor mixture flows more uniformly through openings in the diffuser plate. The uniform flow of the mixture provides for an improved distribution of precursor over a substrate in the reaction chamber and ultimately allows a substantially uniform film to be formed on the substrate.

All, some, or none of these technical advantages may be present in various embodiments of the present invention. Other technical advantages will be readily apparent to one skilled in the art from the following figures, descriptions, and claims.

BRIEF DESCRIPTION OF THE DRAWINGS

A more complete and thorough understanding of the present embodiments and advantages thereof may be acquired by referring to the following description taken in conjunction with the accompanying drawings, in which like reference numbers indicate like features, and wherein.

DETAILED DESCRIPTION OF THE INVENTION

Preferred embodiments of the present invention and their advantages are best understood by reference to FIGS. 1 through 7, where like numbers are used to indicate like and corresponding parts.

The conceptual groundwork for the present invention involves an atomic layer deposition (ALD) process to create highly conformal thin films. In an ALD process, individual precursors are pulsed onto the surface of a substrate contained in a reaction chamber, without mixing the precursors in the gas phase. Each precursor reacts with the surface of the substrate to form an atomic layer in such a way that only one layer forms at a time. The introduction of the precursor into the reaction chamber may be known as a doping. In between doping pulses, the reaction chamber may be purged by flowing a gas over the substrate. The time needed to complete the doping and purge pulses may depend on the flow rate of the precursor or the purge gas. In conventional ALD systems, the precursor or purge gas flows from a gas injector, through a diffuser and into the reaction chamber. The diffuser may include a flat surface having multiple openings to allow the precursor or purge gas to flow into the reaction chamber. If the flow rate of the purge gas during the purge pulse is above a specific level, turbulence may occur near the gas inlet in the injector. The present invention provides a protrusion associated with the diffuser that reduces and even eliminates turbulence in the gas injector. The protrusion may be located opposite the gas inlet such that the purge gas flows over the protrusion and through the openings in the diffuser in a more uniform manner.

Figure 1:
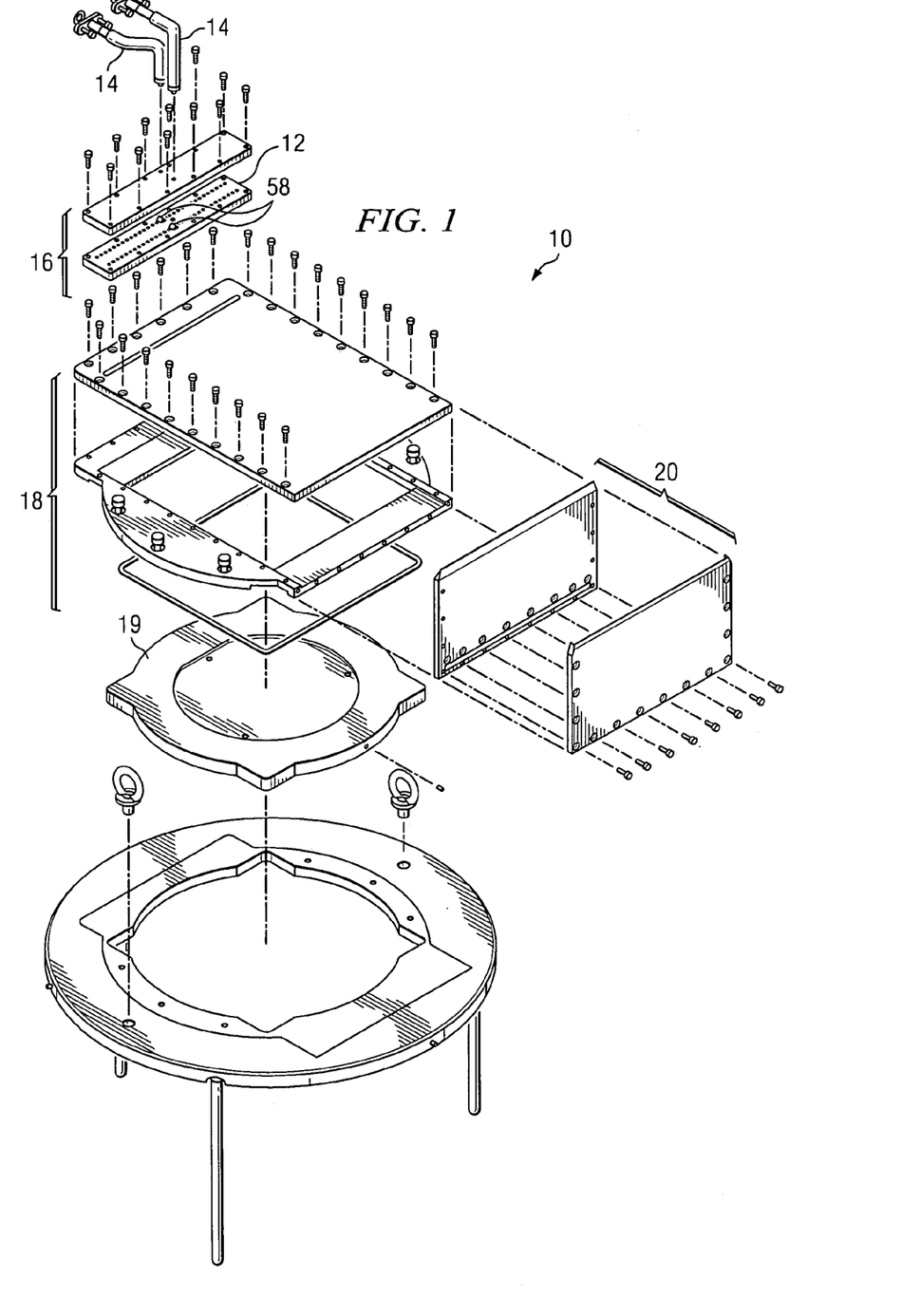
FIG. 1 illustrates an atomic layer deposition (ALD) system for forming a conformal thin film on a substrate according to teachings of the present invention.

FIG. 1 illustrates atomic layer deposition (ALD) system 10 for forming a conformal thin film on a substrate. In the illustrated embodiment, ALD system 10 includes diffuser plate 12, gas lines 14a and 14b (generally referred to as gas lines 14), gas injector 16, reaction chamber 18 and outlet 20. During a purge pulse, a gas may flow through one or both of gas lines 14a and 14b from gas reservoirs. The gas then flows through diffuser plate 12 included in gas injector 16. A protrusion may be located opposite the gas inlet. The protrusion functions to direct the gas within gas injector 16 such that the gas flows in a laminar manner over a wide range of flow rates.

ALD system 10 may include one or more gas reservoirs (not expressly shown) connected to gas injector 16 by gas lines 14. In one embodiment, the reservoirs may contain an inert gas that is used to remove precursor from gas injector 16 during a purge pulse and/or that is combined with a precursor during a doping. In another embodiment, the reservoirs may contain a precursor used during a doping pulse. Gas lines 14 may feed the gas into gas injector 16. In one embodiment, gas lines 14 may be formed of stainless steel and have a diameter of approximate one-quarter (¼) inch. Although the illustrated embodiment shows a particular number of reservoirs and associated gas lines, ALD system 10 may include a single reservoir and gas line or more than two reservoirs and their corresponding gas lines.

Reaction chamber 18 may contain substrate holder 19. In one embodiment, a substrate placed in substrate holder 19 may be a p-type or n-type silicon substrate. In other embodiments, the substrate may be formed from gallium arsenide or any other suitable material that may be used as a substrate on which one or more layers of material may be deposited. The one or more layers deposited by ALD system 10 may form films used to fabricate conformal barriers, high-k dielectrics, gate dielectrics, tunnel dielectrics and barrier layers for semiconductor devices. ALD films are also thermally stable and substantially uniform, which makes them attractive for optical applications. Another potential application for ALD is the deposition of $AlO_x$ as a gap layer for thin film heads, such as heads for recording densities of 50 $Gb/in^2$ and beyond that require very thin and conformal gap layers. Additionally, ALD thin films may be used to form structures with high aspect ratios, such as MicroElectroMechanical (MEM) structures.

The thin film may be formed on a substrate by alternately flowing one or more precursors combined with an inert gas (e.g., a doping pulse) and the inert gas (e.g., a purge pulse) through reaction chamber 18. The precursor may react with the surface of the substrate to form a single layer of film. The doping and purge pulses may be repeated until a thin film having the desired thickness is formed on the substrate. During the pulses, the gas and precursor may be removed from reaction chamber 18 through outlet 20 by a pump (not expressly shown).

During the purge pulse, the gas from the reservoirs expands into an area contained in gas injector 16. In conventional ALD systems, if the flow rate of the gas is high enough (e.g., greater than approximately 500 sccm), turbulence may occur due to the flat surface of a diffuser plate located opposite the gas inlet of gas injector 16. The turbulence prevents the gas in a purge pulse from completely clearing the precursor from gas injector 16 because the precursor may be trapped in the turbulence, which may lead to gas phase reactions during subsequent pulses that form a powder in gas injector 16. As described below in reference to FIG. 2B, the turbulence may decrease the total flow of gas passing through openings in the diffuser plate located near the turbulent zone.

In the present invention, the expansion volume located in gas injector 16 may include a protrusion located opposite the gas inlet. In one embodiment, the protrusion may be integral to diffuser plate 12 located between gas injector 16 and reaction chamber 18. In another embodiment, the protrusion may be separate from diffuser plate 12 and mounted to one of the walls associated with gas injector 16.

In one embodiment, the protrusion may be beveled and the surfaces forming the bevel may have similar or different slopes. In other embodiments, the protrusion may include several sloped segments having different slopes or a surface with a smoothly varying slope. The protrusion functions to reduce and even eliminate turbulence at typical gas flow rates (e.g., approximately 2500 sccm and greater) for an ALD process by directing the flow of the gas through gas injector 16 such that the flow is uniform through each of the openings in the diffuser plate. Additionally, the protrusion may prevent gas phase reactions from occurring in gas injector 16 because the purge pulse more effectively removes the precursor from gas injector 16.

Figure 2A:
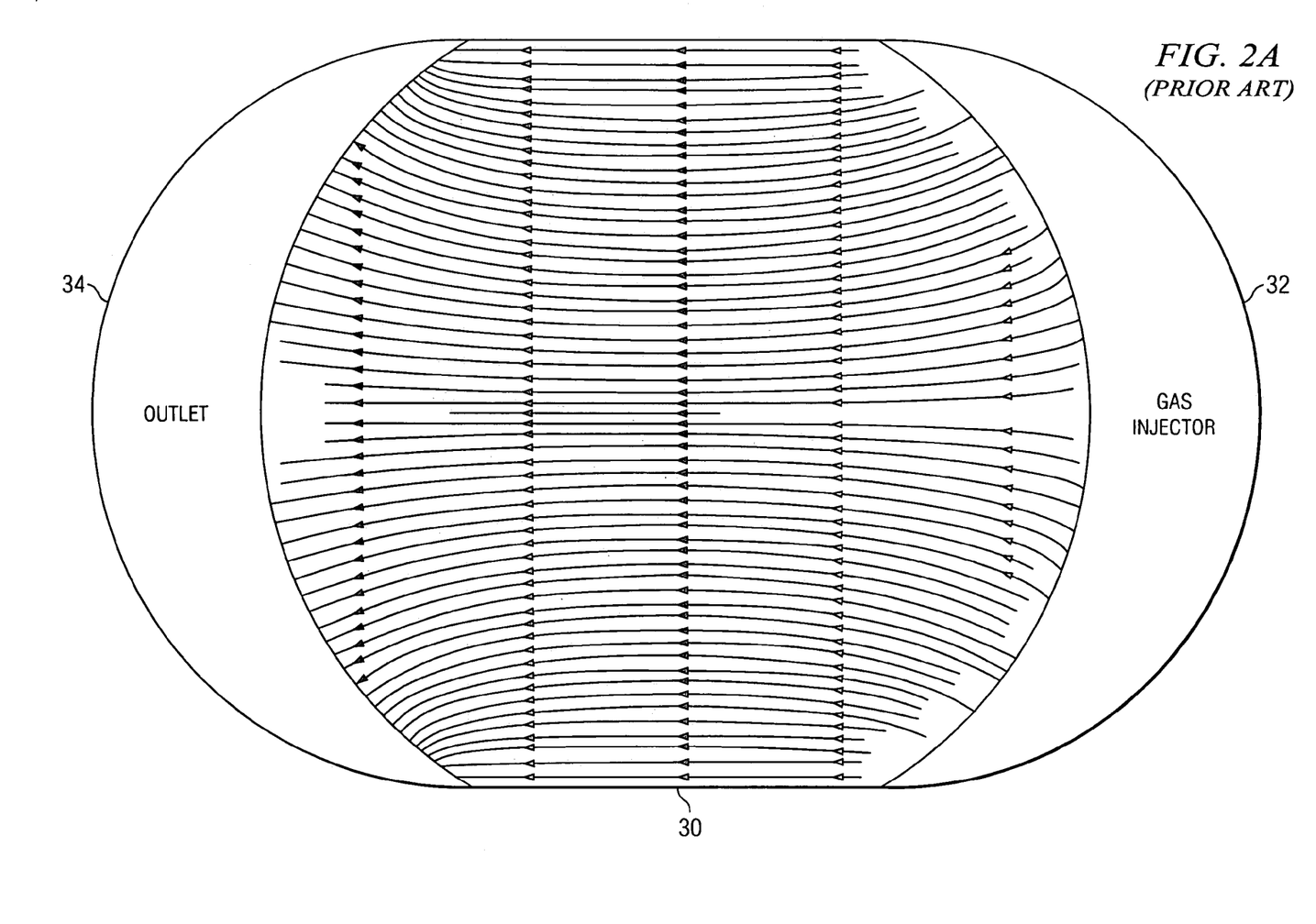
FIGS. 2A and 2B illustrate flow patterns in a gas injector at different flow rates using a conventional diffuser plate.
Figure 2B:
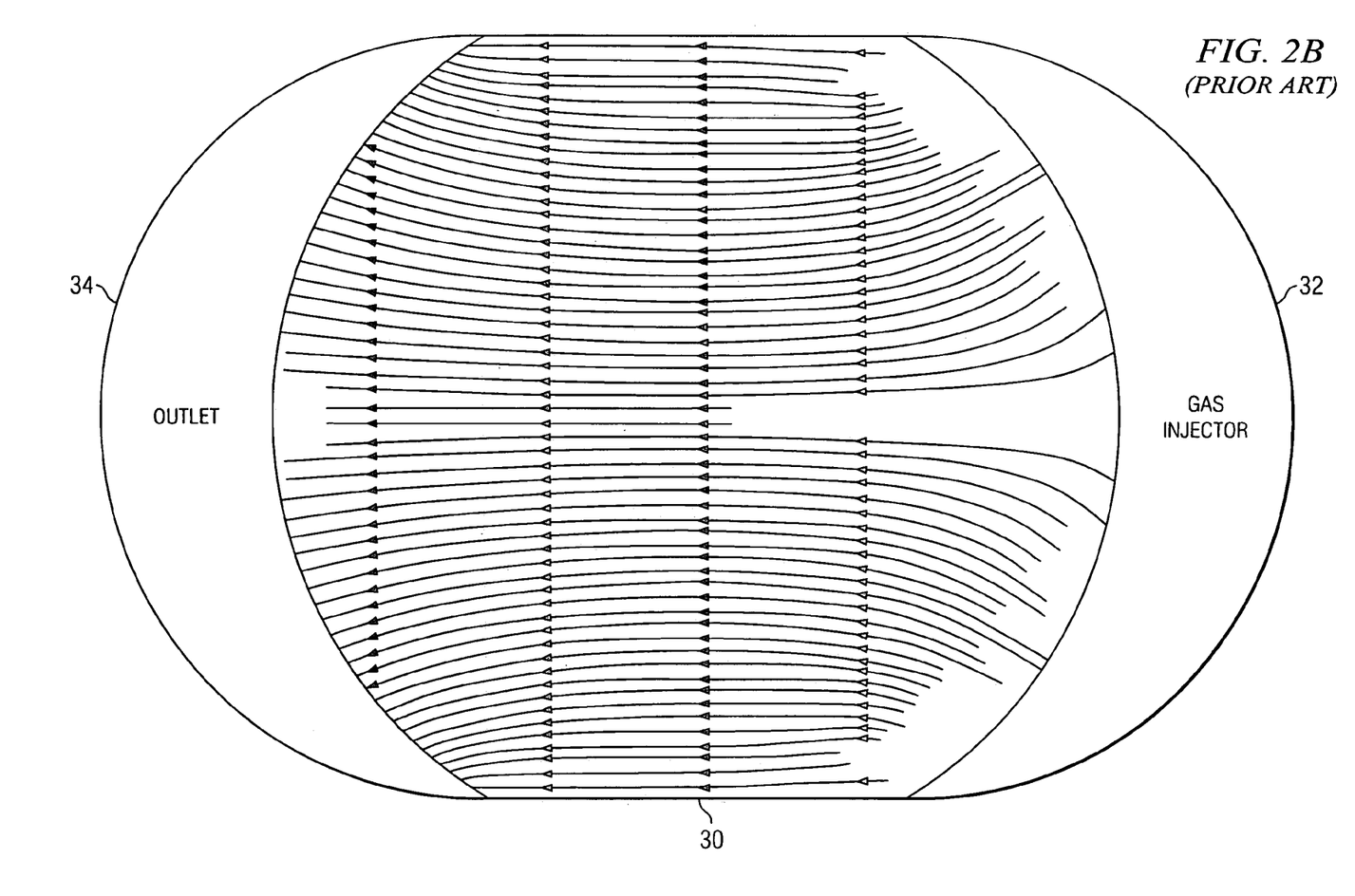

FIGS. 2A and 2B illustrate flow patterns inside of a gas injector at different flow rates using a conventional diffuser plate. Specifically, FIG. 2A illustrates the flow pattern of a gas inside gas injector 30 at a flow rate of approximately 100 sccm. A gas may be introduced into gas injector 30 through gas inlet 32. At the low flow rate, the gas flows substantially uniformly over diffuser plate 34. As shown, no turbulence is present due to the low flow rate and the gas may flow through openings 36 in a uniform manner.

However, as illustrated by FIG. 2B, at a flow rate of approximately 500 sccm (e.g., a rate approximately five times greater than the rate illustrated in FIG. 2A), turbulent zones may occur near gas inlet 32. The turbulence causes a drop in pressure, which causes the flow through openings 36 located opposite gas inlet 32 to be lower than openings 36 located away from gas inlet 32. In some cases, if the pressure in the gas injector near the turbulent zones is lower than the pressure in the reaction chamber, the gas may actually be sucked from the reaction chamber into the gas injector. The different flow through openings 36 may cause an uneven distribution of the precursor during the doping pulse. Additionally, the recirculation in the turbulent zones may lead to inefficient purging of the precursor in gas injector 30, which may cause gas phase reactions that produce powder in gas injector 30. The powder may damage the substrate contained in the reaction chamber and create a need to clean the ALD system more often.

Figure 3A:
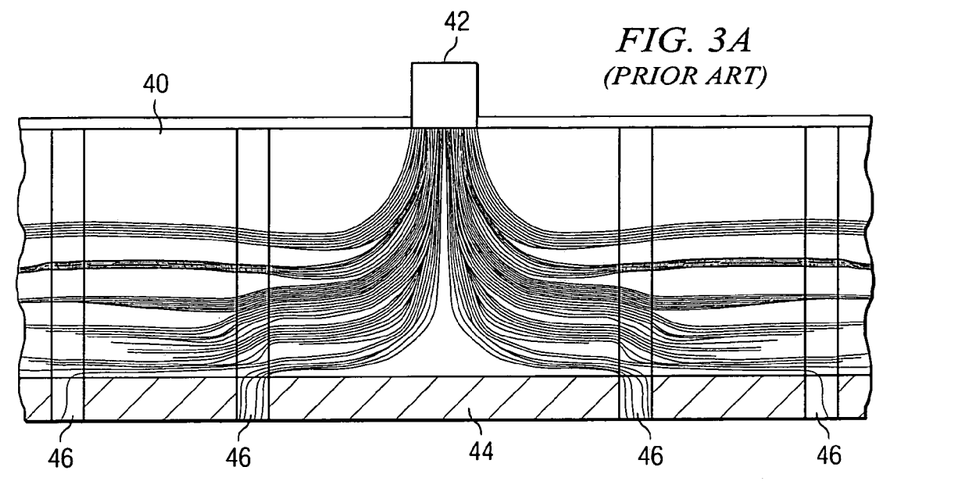
FIGS. 3A and 3B illustrate flow patterns over a substrate at different flow rates using a conventional diffuser plate.
Figure 3B:
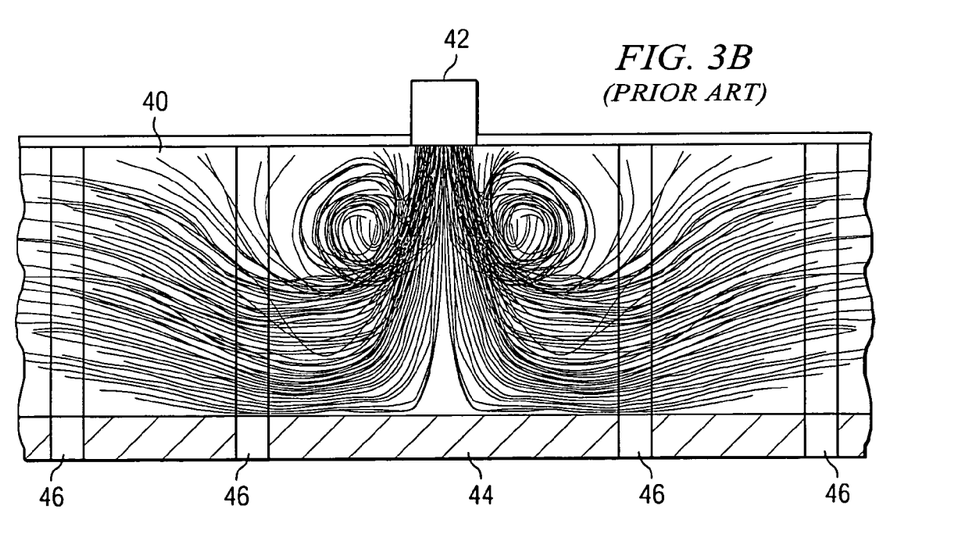

FIGS. 3A and 3B illustrate flow patterns over a substrate at different flow rates using a conventional diffuser plate. Specifically, FIG. 3A shows the flow pattern of a gas above a substrate (not expressly shown) at a flow rate of approximately 133 sccm as calculated by a commercially available computational flow dynamics software (e.g., software developed and sold by CFDRC corporation of Huntsville, Ala.). As illustrated, the gas flows substantially uniformly from gas injector 40 over the substrate to outlet 42. FIG. 3B shows the flow pattern of the gas at a flow rate of approximately 1333 sccm (e.g., a rate approximately ten times greater than the flow rate illustrated in FIG. 3A). As shown, the gas flow over the substrate is substantially different at the higher flow rate, especially in the region directly opposite the gas inlet (not expressly shown) in gas injector 40. As described above in reference to FIG. 2B, a conventional diffuser plate may induce turbulence in the region of gas injector 40 near the gas inlet. As shown in FIG. 3B, the turbulence may reduce the amount of gas flowing through the openings in the diffuser plate that are located opposite the gas inlet. The difference in the flow pattern through the openings in the diffuser plate may cause non-uniform distribution of the precursor over the substrate.

Figure 4:
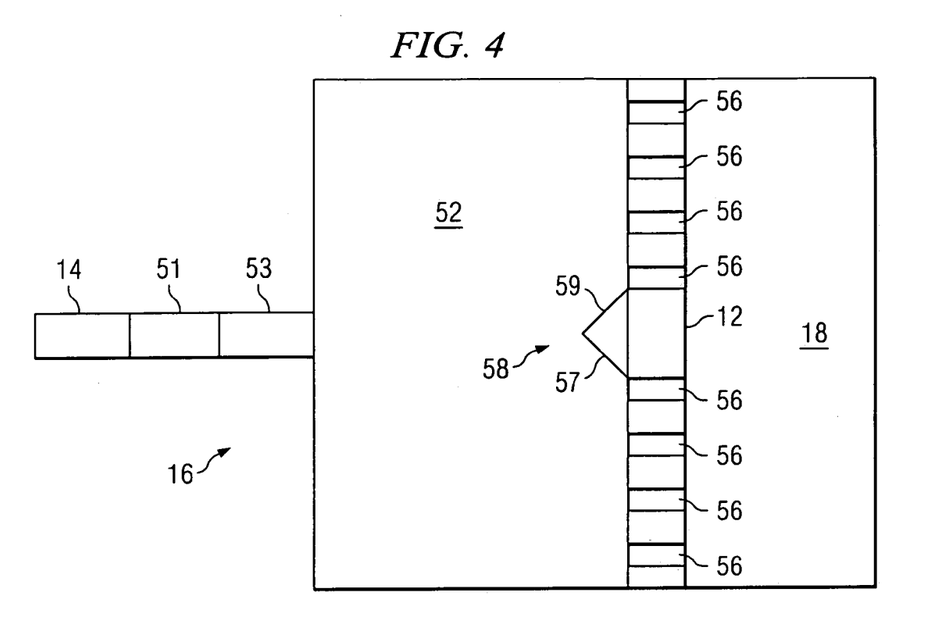
FIG. 4 illustrates an example embodiment of a gas injector associated with an ALD system according to teachings of the present invention.

FIG. 4 illustrates an example embodiment of a diffuser plate including a protrusion located opposite a gas inlet in a gas injector associated with an ALD system. Gas line 14 may include fast valving system 51 located near gas inlet 53 of gas injector 16. Fast valving system 51 may include several subcomponents, such as mass flow controllers and on/off valves to control the flow versus time profiles of the dosing and purge pulses. A gas may flow through fast valving system 51 into expansion volume 52 via gas inlet 53. The flow of gas from expansion volume 52 to reaction chamber 18 may be restricted by diffuser plate 12. In one embodiment, diffuser plate 12 may be a metal plate including at least one opening 56. The number, size and position of openings 56 may be selected to obtain uniform precursor flow in reaction chamber 18 during a doping pulse and uniform gas flow during a purge pulse. Diffuser plate 12 may further be disposable since prolonged use may lead to deposition of the precursor in openings 56 and subsequent alteration of flow characteristics over time.

In the illustrated embodiment, diffuser plate 12 includes protrusion 58 located opposite gas inlet 53. Protrusion 58 may direct the gas flowing into expansion volume 52 such that the gas flows uniformly through each of openings 56 into reaction chamber 18 through openings 56. The height of protrusion 58 may scale with the size of gas inlet 53 and a desired operation range for the flow rate. In general, the size of gas inlet 53 and the flow rate may depend on the size of the substrate, as larger amounts of precursor may be used for larger substrates. In one embodiment, the substrate may have a diameter of approximately 150 millimeters and protrusion 58 may have a height between approximately three millimeters (3 mm) and approximately eight millimeters (8 mm).

Protrusion 58 may include surfaces 57 and 59 that form a bevel. In the illustrated embodiment, surfaces 57 and 59 may have approximately the same length and slope. In other embodiments, one of surfaces 57 and 59 may have a larger slope and/or length than the other surface. In a further embodiment, protrusion 58 may be formed in the shape of an inverted "U" such that the surface of protrusion 58 has a smoothly varying slope. In yet another embodiment, protrusion 58 may include more than two sloped segments where the sloped segments have the same or different slopes and lengths.

Surface 57 may form a first angle ($\Phi_1$) with respect to the surface of diffuser plate 12 and surface 59 may form a second angle ($\Phi_2$) with respect to the surface of diffuser plate 12. In one embodiment, the first and second angles ($\Phi_1$ and $\Phi_2$) may be between approximately thirty degrees (30°) and approximately sixty degrees (60°). The first and second angles ($\Phi_1$ and $\Phi_2$) may be approximately equal or one of the angles may be greater or less than the other angle.

Protrusion 58 functions to direct the gas flow toward openings 56 in diffuser plate 12 such that the amount of gas flowing through each of openings 56 is approximately equal. Protrusion 58 may further function to eliminate turbulence in expansion volume 52 by preventing the gas from bouncing off of the surface of diffuser plate 12 towards gas inlet 53, which further prevents recirculation from occurring near gas inlet 53. By eliminating recirculation of the gas in expansion volume 52, the precursor may be more efficiently purged from expansion volume 52 during the purge pulse, which reduces the possibility of gas phase reactions that may form a powder in expansion volume 52 after prolonged use of ALD system 10.

In another embodiment, protrusion 58 may be separate from diffuser plate 12. Protrusion 58 may be mounted in expansion volume 52 such that protrusion 58 is located opposite gas inlet 53. For example, protrusion 58 may be located on a post mounted to one of the walls of expansion volume 52. The post may have a width or diameter less than or equal to the base of protrusion 58. Additionally, the post may have a shape similar to that of protrusion 58 in order to further aid the flow of gas in expansion volume 52.

In a further embodiment, a wall protrusion, similar to protrusion 58 located on diffuser plate 12, may be formed on at least one of the walls forming expansion volume 52. The wall protrusion may be formed on at least one of the walls in order to provide a more uniform gas flow through expansion volume 52 and to further reduce turbulence at higher flow rates. The wall protrusion may have one or more surfaces. In one embodiment, the surfaces may have approximately the same lengths and/or slopes. In other embodiments, the surfaces of the wall protrusion may have different lengths and/or slopes. In further embodiments, the surface of the wall protrusions may form an inverted "U".

Figure 5:
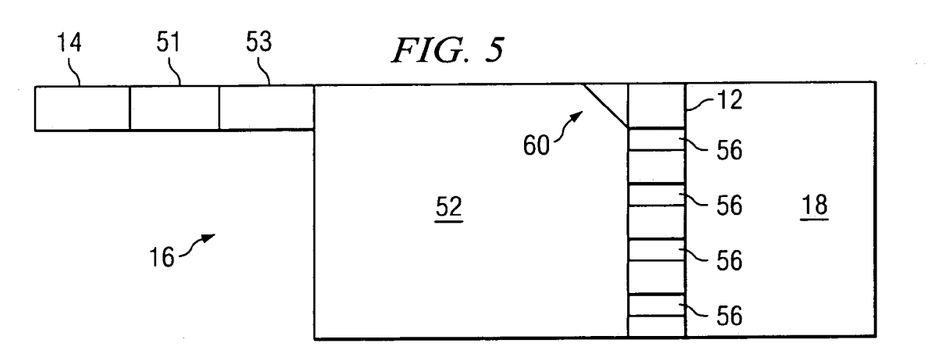
FIG. 5 illustrates another example embodiment of a gas injector associated with an ALD system according to teachings of the present invention.

FIG. 5 illustrates another example embodiment of a diffuser plate including a protrusion located opposite a gas inlet in a gas injector associated with an ALD system. In the illustrated embodiment, gas inlet 53 may be located at the top of expansion volume 52, rather than the center as illustrated in FIG. 4. Diffuser plate 12 may include protrusion 60 that functions to direct the gas flow toward the bottom of expansion volume 52. In another embodiment, protrusion 66 may be separate from diffuser plate 12 and formed on the wall of expansion volume 52. Protrusion 60 may form an angle (Φ) with respect to the surface of diffuser plate 12 of approximately thirty degrees (30°) to approximately sixty degrees (60°). Protrusion 60 may allow the gas flow to be evenly distributed through openings 56 such that a precursor is evenly distributed in reaction chamber 18.

Although protrusion 60 is illustrated as having a single surface adjacent to a wall of expansion volume 52, protrusion 60 may also have multiple surfaces. For example, gas inlet 53 may be located in a slightly asymmetrical position relative to the walls of expansion volume 52. Protrusion 60 may include at least two surfaces, where the surface extending toward the larger portion of expansion volume 52 may have a greater length than the surface extending toward the smaller area of expansion volume 52.

Figure 6A:
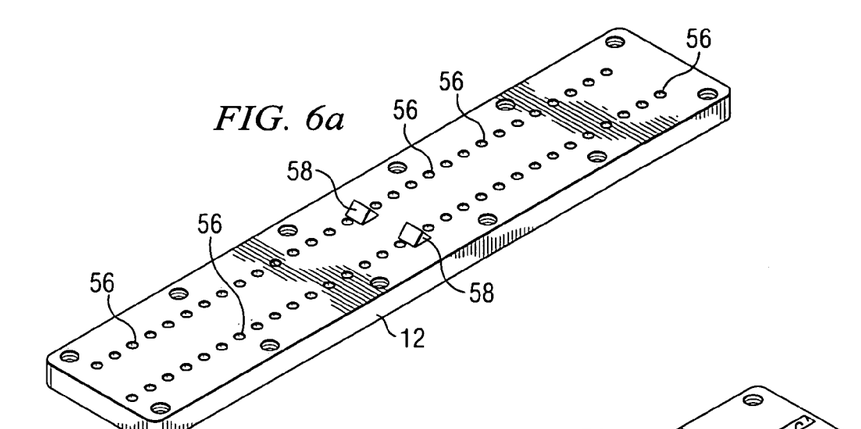
FIGS. 6a and 6b respectively illustrate a top view and a bottom view of an example embodiment of a diffuser plate including protrusions formed on a top surface according to teachings of the present invention.
Figure 6B:
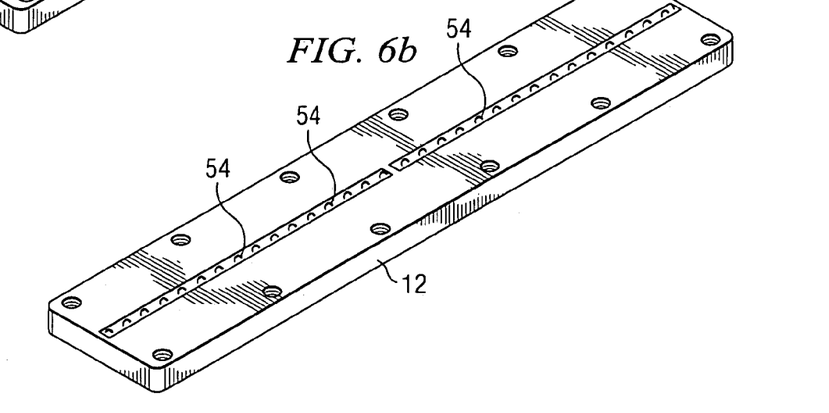

FIGS. 6a and 6b respectively illustrate a top view and a bottom view of an example embodiment of diffuser plate 12 including protrusions 58a and 58b. As illustrated in FIG. 1, ALD system 10 may include gas lines 14a and 14b. Each of gas lines 14a and 14b may include a corresponding gas inlet and when diffuser plate 12 is used in ALD system 10, protrusions 58a and 58b may be respectively located opposite the gas inlets for gas lines 14a and 14b. In this example, protrusions 58a and 58b may respectively prevent turbulence from forming near the gas inlets associated with gas lines 14a and 14b. In other embodiments, diffuser plate 12 may include any suitable number of protrusions 58 such that at least one protrusion is located opposite each of the gas inlets associated with the expansion volume of a gas injector.

As shown in FIG. 6a, diffuser plate 12 includes two rows of openings 56 formed on a front surface. As described above in reference to protrusions 58a and 58b, the two rows of openings 56 may correspond to the number of gas inlets associated with the expansion volume. In other embodiments, diffuser plate 12 may include one row or greater than two rows of openings 56 where the number of rows depends on the number of gas inlets associated with the expansion volume of the gas injector.

As shown in FIG. 6b, diffuser plate 12 may include chamber openings 54 formed on a back surface. Chamber openings 54 may be located adjacent to reaction chamber 18 when diffuser plate 12 is included in ALD system 10 illustrated in FIG. 1. In order to ensure that the precursor and gas enters reaction chamber 18 through each one of openings 56 at the same location, openings 56 may be interleaved in diffuser plate 12 to form a single row of chamber openings 54. In the illustrated embodiment, openings 56 may be formed in diffuser plate 12 at a forty-five degree angle with respect to the normal of the surface of diffuser plate 12. In other embodiments, openings 56 may be formed in diffuser plate 12 at a suitable angle such that each of openings 56 forms a single corresponding chamber opening 54. In a further embodiment, the number of rows of chamber openings 54 formed on a back surface of diffuser plate 12 may be equal to the number of rows of openings 56 formed on a front surface of diffuser plate 12.

Figure 7:
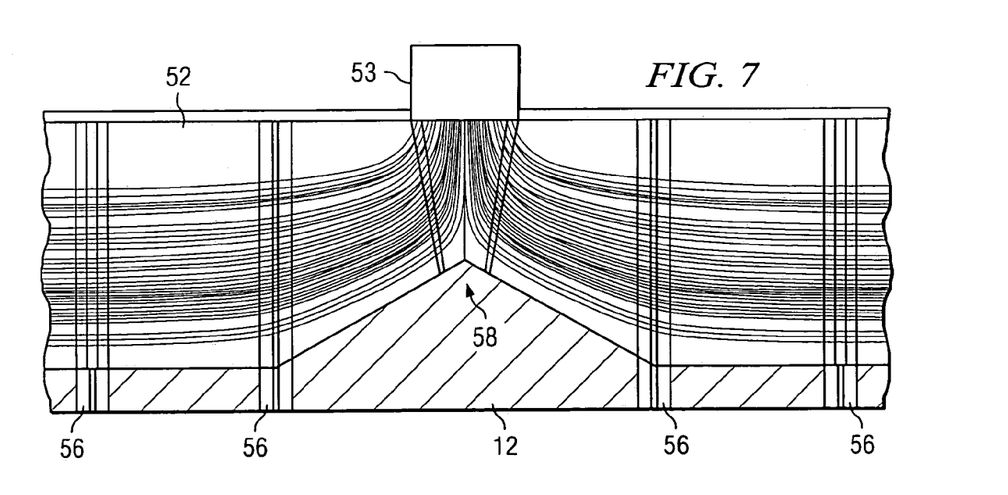
FIG. 7 illustrates a gas injector flow pattern using a beveled diffuser plate according to teachings of the present invention.

FIG. 7 illustrates a gas injector flow pattern using a beveled diffuser plate. In the illustrated embodiment, the flow rate is approximately 8000 sccm. As shown, protrusion 58 may facilitate a laminar gas flow at a flow rate approximately sixteen (16) times greater than the flow rate at which the conventional diffuser plate illustrated in FIG. 2B shows significant turbulence. The gas, therefore, may be evenly distributed through each of openings 56 and the precursor distribution in reaction chamber 18 may be improved.

Although the present invention has been described with respect to a specific preferred embodiment thereof, various changes and modifications may be suggested to one skilled in the art and it is intended that the present invention encompass such changes and modifications fall within the scope of the appended claims.

What is claimed is:

1. A method of fabricating a conformal film on a substrate, comprising:
   introducing a gas from a gas inlet into an expansion volume associated with an atomic layer deposition (ALD) system, the ALD system further including a reaction chamber; and
   flowing the gas through a diffuser plate adjacent to the expansion volume and the reaction chamber, the diffuser plate including a protrusion located opposite the gas inlet, the protrusion operable to reduce turbulence in the expansion volume.

2. The method of claim 1, further comprising the protrusion operable to reduce gas phase reactions in the expansion volume.

3. The method of claim 1, further comprising the protrusion operable to facilitate an increased gas flow rate from the expansion volume to the reaction chamber.

4. The method of claim 1, further comprising:
   the diffuser plate including a plurality of openings through which the gas flows into the reaction chamber; and
   the protrusion operable to facilitate uniform gas flow through the openings.

5. The method of claim 1, wherein the protrusion comprises a bevel.

6. The method of claim 1, wherein the protrusion comprises a first surface and a second surface.

7. The method of claim 6, further comprising the first and second surfaces forming an angle of between approximately thirty degrees and approximately sixty degrees with respect to the diffuser plate.

8. The method of claim 6, further comprising the first and second surfaces including substantially similar lengths.

9. The method of claim 6, further comprising the first and second surfaces including substantially similar slopes.

10. The method of claim 6, further comprising the first and second surfaces including different lengths.

11. The method of claim 6, further comprising the first and second surfaces including different slopes.

12. The method of claim 1, wherein the protrusion comprises a sloped surface.

13. The method of claim 1, further comprising the protrusion including a surface having a smoothly varying slope.

14. The method of claim 1, further comprising:
the expansion volume formed by a top wall, a bottom wall and two side walls; and
a wall protrusion formed on at least one of the top, bottom and side walls.

15. The method of claim 1, further comprising the gas including a flow rate between approximately 100 sccm and 10,000 sccm.

16. The method of claim 1, wherein the gas comprises an inert gas.

17. The method of claim 1, further comprising purging the reaction chamber with the gas flowing through the diffuser plate.

18. An apparatus for fabricating a conformal thin film on a substrate, comprising:
a reaction chamber; and
a gas injector adjacent to the reaction chamber, the gas injector including:
an expansion volume;
a gas inlet operable to introduce a gas into the expansion volume;
a diffuser plate located adjacent the expansion volume and the reaction chamber; and
a protrusion located adjacent to the diffuser plate and opposite the gas inlet, the protrusion operable to reduce turbulence in the expansion volume.

19. The apparatus of claim 18, further comprising the protrusion operable to reduce gas phase reactions in the expansion volume.

20. The apparatus of claim 18, further comprising the protrusion operable to facilitate an increased gas flow rate from the expansion volume to the reaction chamber.

21. The apparatus of claim 18, further comprising:
the diffuser plate including at least one row of openings on a first surface through which the gas flows into the reaction chamber; and
the protrusion operable to facilitate uniform gas flow through the openings.

22. The apparatus of claim 21, further comprising the openings interleaved such that a second surface of the diffuser plate includes one row of chamber openings.

23. The apparatus of claim 18, wherein the protrusion comprises a bevel.

24. The apparatus of claim 18, wherein the protrusion comprises a first surface and a second surface.

25. The apparatus of claim 24, further comprising the first and second surfaces forming an angle of between approximately thirty degrees and approximately sixty degrees with respect to the diffuser plate.

26. The apparatus of claim 24, further comprising the first and second surfaces including substantially similar lengths.

27. The apparatus of claim 24, further comprising the first and second surfaces including substantially similar slopes.

28. The apparatus of claim 24, further comprising the first and second surfaces including different lengths.

29. The apparatus of claim 24, further comprising the first and second surfaces including different slopes.

30. The apparatus of claim 18, further comprising the protrusion including a surface having a smoothly varying slope.

31. The apparatus of claim 18, further comprising the protrusion including a sloped surface.

32. The apparatus of claim 18, further comprising:
the expansion volume formed by a top wall, a bottom wall and two side walls; and
a wall protrusion formed on at least one of the top, bottom and side walls.

33. The apparatus of claim 18, wherein the gas comprises a flow rate between approximately 100 sccm and 10,000 sccm.

34. The apparatus of claim 18, wherein the gas comprises an inert gas.

35. An apparatus for fabricating a conformal thin film on a substrate, comprising:
a reaction chamber; and
a gas injector adjacent to the reaction chamber, the gas injector including:
an expansion volume;
a gas inlet operable to introduce an inert gas into the expansion volume; and
a diffuser plate located adjacent the expansion volume and the reaction chamber, the diffuser plate including a bevel located opposite the gas inlet, the bevel operable to reduce turbulence and gas phase reactions in the expansion volume.

36. The apparatus of claim 35, further comprising:
the diffuser plate including at least one row of openings through which the inert gas flows into the reaction chamber; and
the bevel operable to facilitate uniform gas flow through the openings.

37. The apparatus of claim 36, further comprising the openings interleaved such that a second surface of the diffuser plate includes one row of chamber openings.

38. The apparatus of claim 35, wherein the bevel comprises a first surface and a second surface, the first and second surfaces including substantially similar lengths and substantially similar slopes.

39. The apparatus of claim 35, wherein the bevel comprises a first surface and a second surface, the first and second surfaces including different lengths and different slopes.

40. The apparatus of claim 35, further comprising:
the expansion volume formed by a top wall, a bottom wall and two side walls; and
a wall protrusion formed on at least one of the top, bottom and side walls.

* * * * *